(12) United States Patent
Oh et al.

(10) Patent No.: US 11,747,676 B2
(45) Date of Patent: Sep. 5, 2023

(54) DISPLAY DEVICE

(71) Applicant: LG Display Co., Ltd., Seoul (KR)

(72) Inventors: Ji-Soon Oh, Daegu (KR); Cheol-Woo Park, Goyang-si (KR); Yeoun-Jei Jung, Daegu (KR); Jung-Mok Lee, Gumi-si (KR); Keum-Young Oh, Chilgok-gun (KR)

(*) Notice: Subject to any disclaimer, the term of this patent is extended or adjusted under 35 U.S.C. 154(b) by 0 days.

(21) Appl. No.: 17/864,058

(22) Filed: Jul. 13, 2022

(65) Prior Publication Data

US 2022/0350204 A1 Nov. 3, 2022

Related U.S. Application Data

(62) Division of application No. 16/545,450, filed on Aug. 20, 2019, now Pat. No. 11,435,618.

(30) Foreign Application Priority Data

Sep. 7, 2018 (KR) .................... 10-2018-0107130

(51) Int. Cl.
*G02F 1/13357* (2006.01)
*H05K 1/18* (2006.01)
*G02F 1/1333* (2006.01)
*G02F 1/1335* (2006.01)

(52) U.S. Cl.
CPC .. *G02F 1/133608* (2013.01); *G02F 1/133308* (2013.01); *G02F 1/133603* (2013.01); *G02F 1/133605* (2013.01); *G02F 1/133606* (2013.01); *H05K 1/189* (2013.01); *G02F 1/133612* (2021.01); *H05K 2201/056* (2013.01);

(Continued)

(58) Field of Classification Search
CPC ......... G02F 1/133608; G02F 1/133603; G02F 1/133605; G02F 1/133606; G02F 1/133612
USPC ...................................... 349/61–68
See application file for complete search history.

(56) References Cited

U.S. PATENT DOCUMENTS

| 2005/0141212 A1 | 6/2005 | Moon et al. |
| 2008/0088769 A1 | 4/2008 | Kim et al. |
| 2008/0122994 A1 | 5/2008 | Cemasov |

(Continued)

FOREIGN PATENT DOCUMENTS

| CN | 1637522 A | 7/2005 |
| CN | 101354498 A | 1/2009 |

(Continued)

*Primary Examiner* — Charles S Chang
(74) *Attorney, Agent, or Firm* — SEED IP GROUP LLP

(57) ABSTRACT

Disclosed is a display device. The display device achieves a slim bezel by forming a through hole at a bottom portion of a cover, and changing a connection structure of a sub-FPCB to be connected to a main FPCB such that the connection structure extends through the cover without extending along the outside of the cover. The display device achieves a reduction in the thickness of the display device and an enhancement in picture quality through change of an installation direction of an LED module constituted by a main FPCB and LED elements disposed at one surface of the main FPCB. The display device can reduce a space where a sensor unit is disposed in conventional cases by mounting the sensor unit on the LED module, and can realize an additional function such as skin care or sterilization in accordance with the kind of the sensor unit.

19 Claims, 5 Drawing Sheets

(52) U.S. Cl.
CPC .............. *H05K 2201/10106* (2013.01); *H05K 2201/10151* (2013.01)

(56) References Cited

U.S. PATENT DOCUMENTS

| | | |
|---|---|---|
| 2009/0002595 A1* | 1/2009 | Kim .................. G02F 1/133308 349/61 |
| 2009/0116222 A1 | 5/2009 | Hamada |
| 2010/0073914 A1 | 3/2010 | Park et al. |
| 2015/0304467 A1 | 10/2015 | Seo |
| 2016/0033714 A1 | 2/2016 | Liu |
| 2017/0061898 A1 | 3/2017 | Takayanagi |
| 2019/0125905 A1 | 5/2019 | Weeks, Jr. et al. |
| 2020/0081295 A1 | 3/2020 | Oh et al. |
| 2020/0081298 A1 | 3/2020 | Liao et al. |
| 2020/0201117 A1 | 6/2020 | Zheng et al. |

FOREIGN PATENT DOCUMENTS

| | | |
|---|---|---|
| CN | 201599652 U | 10/2010 |
| CN | 103411184 A | 11/2013 |
| CN | 103629600 A | 3/2014 |
| CN | 103775919 A | 5/2014 |
| CN | 107402475 A | 11/2017 |
| CN | 109100886 A | 12/2018 |
| CN | 109375402 A | 2/2019 |

\* cited by examiner

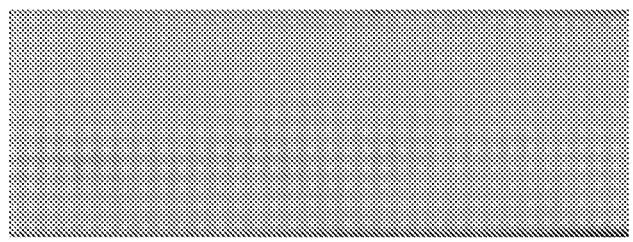
FIG. 5A
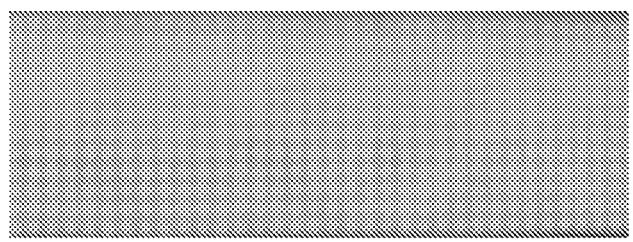
FIG. 5B
FIG. 6
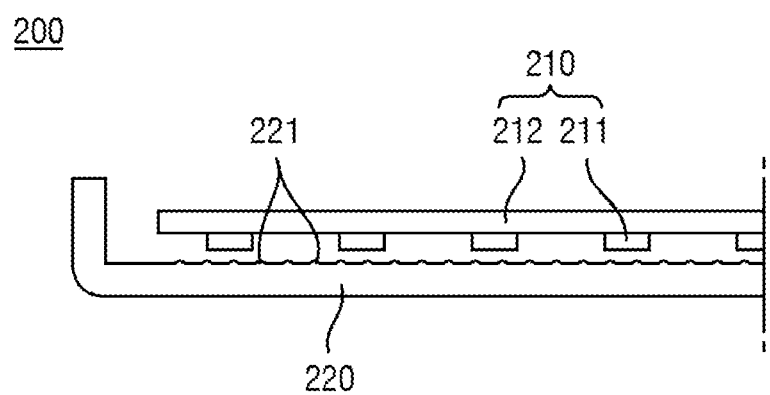

DISPLAY DEVICE

CROSS-REFERENCE TO RELATED APPLICATION(S)

This application is a divisional application of U.S. Patent Application No. 16/545,450, filed on Aug. 20, 2019; which claims the benefit of Korean Patent Application No. 10-2018-0107130, filed on Sep. 7, 2018, which is hereby incorporated by reference as if fully set forth herein.

BACKGROUND

Technical Field

The present disclosure relates to a display device capable of achieving an enhancement in image quality and a reduction in bezel size through change of an installation direction of a light emitting diode (LED) module or an improved connection structure of the LED module.

Description of the Related Art

Recently, in information-dependent society, displays (or display devices) have been highly important as a visual information transfer medium. Such displays should satisfy demand for low power consumption, thinness, lightness, high picture quality, etc., in order to hold an important position in future.

Displays may be classified into emissive displays, which emit light by themselves, for example, a cathode ray tube (CRT), an electroluminescent (EL) display, an LED display, a vacuum fluorescent display (VFD), a field emission display (FED) and a plasma display panel (PDP) and non-emissive displays, which cannot emit light by themselves, for example, a liquid crystal display (LCD).

Among various displays as mentioned above, the LCD, which expresses an image using an optical anisotropic property of liquid crystals, is highlighted as a display device because the LCD exhibits superior visibility, as compared to existing CRTs, while exhibiting low average power consumption and low heat generation, as compared to CRTs having the same screen size as the LCD.

Such an LCD is a display device in which a light source is disposed beneath liquid crystals, and an image is expressed by adjusting transmittance of light generated from the light source through control of alignment of the liquid crystals by application of an electric field to the liquid crystals. The LCD is applied to various electronic equipment such as a smartphone and a tablet personal computer (PC). In particular, in the LCD, a liquid crystal panel is disposed beneath a cover glass, and a backlight unit is disposed beneath the liquid crystal panel. The LCD also includes a guide panel for accommodating the liquid crystal panel or the backlight unit therein, and a cover bottom disposed outside the guide panel and coupled to the guide panel.

In connection with such an LCD, however, there is continuously increased demand for lightness and thinness in accordance with current consumer trends. Furthermore, there is demand for a structure having a thin bezel or no bezel.

BRIEF SUMMARY

Accordingly, the present disclosure is directed to a display device that substantially obviates one or more problems due to limitations and disadvantages of the related art.

An object of the present disclosure is to provide a display device capable of embodying a thinner bezel through a changed shape of a cover and an improved connection structure of a light emitting diode (LED) module.

Another object of the present disclosure is to provide a display device capable of achieving a reduction in thickness while achieving an enhancement in picture quality through change of an installation direction of an LED module.

Another object of the present disclosure is to provide a display device capable of reducing a space where a sensor unit is disposed in conventional cases by mounting the sensor unit on an LED module, and realizing an additional function such as skin care or sterilization in accordance with the kind of the sensor unit.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a display device achieves a slim bezel by forming a through hole at a portion of a cover, and changing a connection structure of a sub-flexible printed circuit board (FPCB) to be connected to a main FPCB such that the connection structure extends through the cover without extending along the outside of the cover.

In another aspect of the present disclosure, a display device achieves a reduction in the thickness of the entirety of the display device and an enhancement in picture quality through change of an installation direction of a light emitting diode (LED) module constituted by a main FPCB and a plurality of LED elements disposed at one surface of the main FPCB.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings:

FIG. 5A is a reference view illustrating a picture quality without use of the teaching of the disclosure in which a mura is present;

FIG. 5B is a reference view illustrating a picture quality at a portion of the display device illustrated in FIG. 4;

FIGS. 6 to 8 are sectional views respectively illustrating other embodiments of the display device illustrated in FIG. 4;

DETAILED DESCRIPTION

Figure 1:
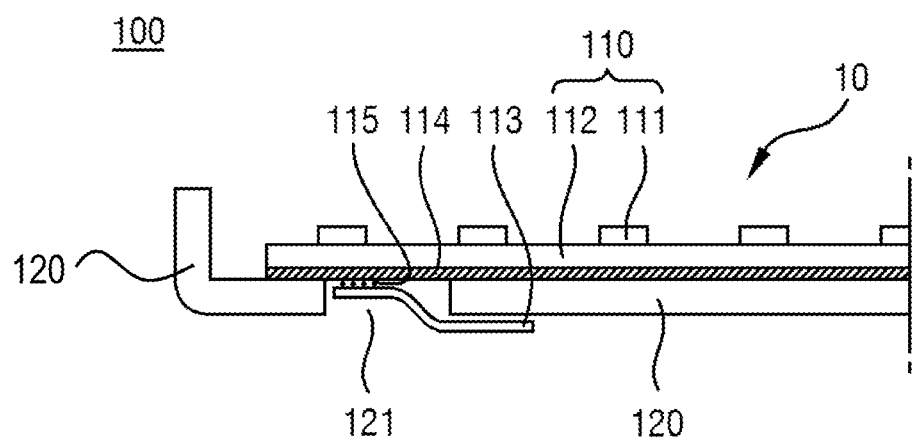
FIG. 1 is a sectional view illustrating a display device according to a first embodiment of the present invention.

Hereinafter, preferred embodiments of the present disclosure will be described in detail with reference to the accompanying drawings and, as such, may be easily implemented by one of ordinary skill in the art to which the present disclosure pertains. Wherever possible, the same reference numbers will be used throughout the drawings to refer to the same or like parts. In the following description of the present disclosure, a detailed description of known functions and configurations incorporated herein will be omitted when it may obscure the subject matter of the present disclosure. Some features shown in the drawings may be enlarged, reduced or simplified for convenience of description. The drawings and constituent elements shown therein may not have an appropriate scale. Of course, such detailed matters will be readily appreciated by those skilled in the art.

Figure 2:
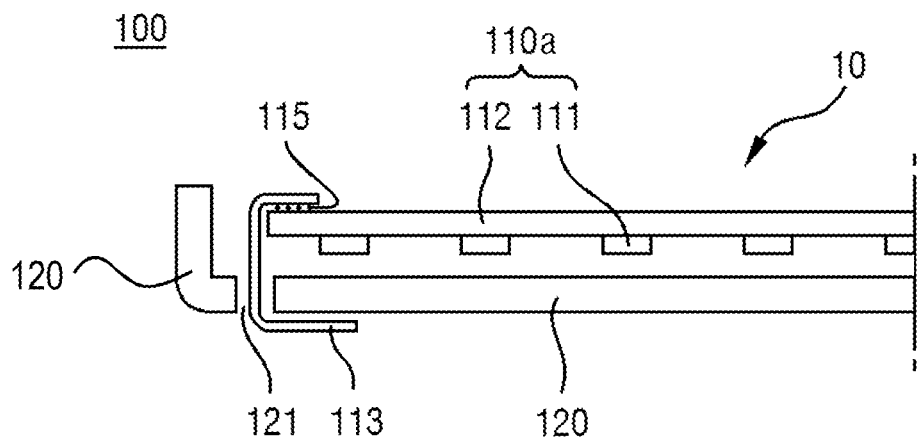
FIGS. 2 and 3 are sectional views respectively illustrating other embodiments of the display device illustrated in FIG. 1.
Figure 3:
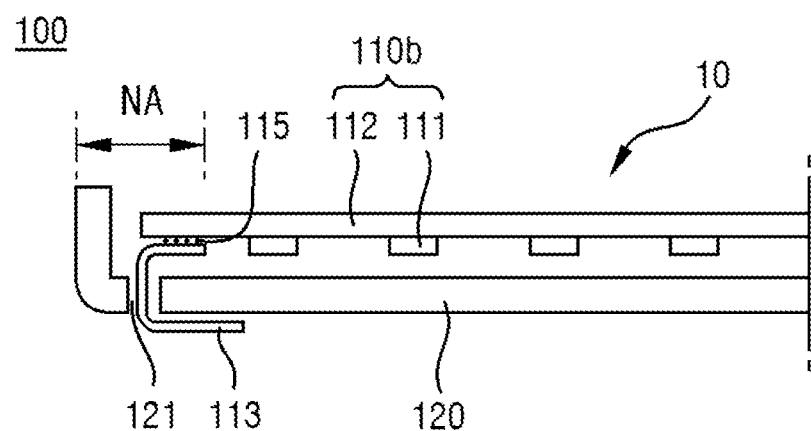

FIG. 1 is a sectional view illustrating a display device according to a first embodiment of the present disclosure. FIGS. 2 and 3 are sectional views respectively illustrating other embodiments of the display device illustrated in FIG. 1.

Referring to FIGS. 1 to 3, the display device of the present disclosure, which is designated by reference numeral "100," includes a main flexible printed circuit board (FPCB) 112 provided with a plurality of light emitting diode (LED) elements, a sub-FPCB 113, and a cover bottom 120. The cover bottom 120 is a part or, in some instances, all of the cover. Here, the LED elements 111, the main FPCB 112 and the sub-FPCB 113 constitute a backlight unit 10. The main FPCB 112 is a first FPCB and the sub-FPCB is a second FPCB. In many embodiments, the second FPCB will be coupled to the main, or first FPCB. A liquid crystal panel (not shown) for rendering an image is disposed over the backlight unit 10. The cover bottom 120 is disposed beneath the backlight unit 10 in order to cover the backlight unit 10.

At the liquid crystal panel, pixels are arranged in a matrix, to output an image. The liquid crystal panel includes a color filter substrate and an array substrate, which are assembled to face each other such that a uniform cell gap is maintained between the color filter substrate and the array substrate. The liquid crystal panel also includes a liquid crystal layer formed in the cell gap between the color filter substrate and the array substrate. Of course, a common electrode and pixel electrodes are formed at the liquid crystal panel, which includes an assembly of the color filter substrate and the array substrate, to apply an electric field to the liquid crystal layer. When voltages of data signals to be applied to respective pixel electrodes under the condition that a voltage is applied to the common electrode, liquid crystals of the liquid crystal layer are rotated due to dielectric anisotropy thereof exhibited due to an electric field generated between the common electrode and each pixel electrode, thereby allowing or preventing passage of light through the liquid crystal layer on a per pixel basis. As such, an image or characters are displayed.

In this case, switching elements such as thin film transistors (TFTs) are provided at respective pixels in order to control voltages of data signals applied to respective pixel electrodes on a per pixel basis.

That is, gate lines and data lines are formed at the array substrate such that the gate lines and the data lines are arranged in vertical and horizontal directions, to define pixel areas. TFTs, which are switching elements, are formed at intersection areas of the gate lines and the data lines on the array substrate, respectively.

Each TFT includes a gate electrode connected to a corresponding one of the gate lines, a source electrode connected to a corresponding one of the data lines, and a drain electrode connected to a corresponding one of the pixel electrodes.

The color filter substrate may include a color filter constituted by a plurality of sub-color filters for rendering red, green and blue (RGB) colors, a black matrix for dividing the sub-color filters from one another and blocking light passing through the liquid crystal layer, and an overcoat layer formed over the color filter and the black matrix.

Polarization plates are attached to outer surfaces of the color filter substrate and the array substrate, respectively. In this case, a lower one of the polarization plates polarizes light emerging from the backlight unit 10 in a direction toward the array substrate, and an upper one of the polarization plates polarizes light emerging from the liquid crystal panel.

A guide panel may be provided at an edge of the backlight unit 10 beneath the liquid crystal panel. The guide panel supports the liquid crystal panel disposed thereover. The guide panel is accommodated in the cover bottom 120, together with the backlight unit 10 which is disposed within the guide panel.

Meanwhile, when the LED module 110 is of an edge type, the backlight unit 10 may include a light guide plate disposed beneath the liquid crystal panel, and a reflective plate disposed at a lower surface of the light guide plate. The following description will be given in conjunction with an example in which the LED module 110 is of a direct type lighting of an LCD display panel.

As described above, the LED module 110 includes the plurality of LED elements 111, each of which is a light source for generating light, the main FPCB 112, on which the LED elements 111 are arranged in a predetermined pattern, and the sub-FPCB 113, which is connected to the main FPCB 112.

A plurality of optical sheets (not shown) may be disposed over the backlight module 10 in order to enhance luminous efficacy of light emitted from the light sources and, as such, light having enhanced luminous efficacy is emitted to the liquid crystal panel.

The LED module 110 is attached to an inner upper surface of the cover bottom 120 by an adhesive layer 114. In this case, a connector 115 to be connected to the sub-FPCB 113 is provided at a lower surface of the main FPCB 112. The sub-FPCB 113 is connected to an external of the display device through a through hole 121 formed at the cover bottom 120 after being connected to the connector 115 at the lower surface of the main FPCB 112.

The through hole 121 formed at the cover bottom 120 is disposed at an area where a lower surface of the LED module 110 is attached to the cover bottom 120. Plural sub-FPCBs 113 may be connected to the external of the display device through plural through holes 121, respectively.

FIG. 2 illustrates an inverted state of a direct type LED module 110a. In the case of FIG. 2, a plurality of LED elements 111 is disposed on a main FPCB 112 to face the inner upper surface of the cover bottom 120. In this case, the through hole 121 formed at the cover bottom 120 is disposed at an edge area of the cover bottom 120 in order to enable a sub-FPCB 113 to be connected to an edge portion of the LED module 110a. In this case, the LED elements 111 are disposed at one surface of the main FPCB 112. A connector 115 is disposed at the other surface of the main FPCB 112, and is connected to the sub-FPCB 113.

In the case of FIG. 3, a plurality of LED elements 111 is disposed at one surface of a main FPCB 112. A connector 115 is disposed at an edge portion of the surface of the main FPCB 112 where the LED elements 111 are not disposed. The connector 115 is connected to a sub-FPCB 113.

When the main FPCB 112 and the sub-FPCB 113 in each case are connected through an inner area of the cover bottom 120, as described above, there may be an effect capable of easily embodying a slim bezel because of a reduction in non-display area (NA), as compared to a structure in which a connection structure of FPCBs surrounds an outer area of the cover bottom 120.

The inverted structure of the LED module not described in conjunction with FIGS. 2 and 3 will be described later in detail.

Figure 4:
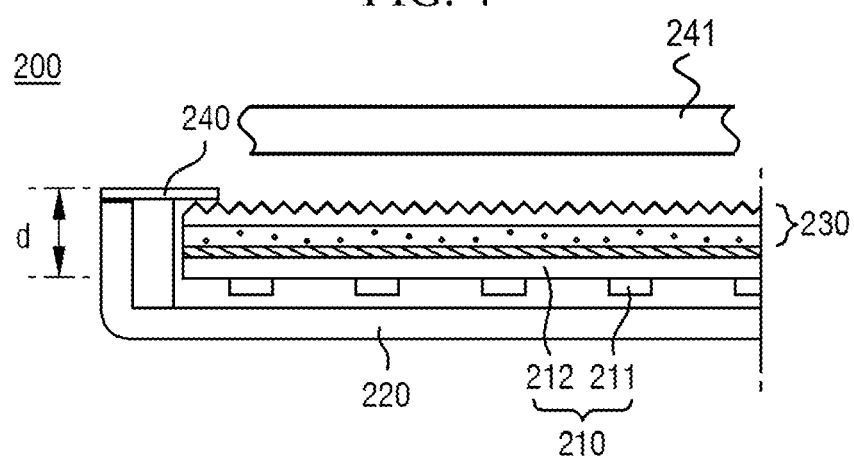
FIG. 4 is a sectional view illustrating a display device according to a second embodiment of the present invention.

FIG. 4 is a sectional view illustrating a display device according to a second embodiment of the present disclosure.

FIG. 5A is a reference view illustrating a picture quality without use of the teaching of the disclosure in which a mura is present.

FIG. 5B is a view of at a portion of the display device illustrated in FIG. 4 with the teaching of this disclosure being present.

Referring to FIG. 4, the display device according to the second embodiment of the present disclosure, which is designated by reference numeral "200," includes an LED module 210, a cover bottom 220, an optical sheet 230, and a guide panel 240.

The LED module 210 includes a plurality of LED elements 211, and a main FPCB 212 on which the LED elements 211 are arranged in a direct type pattern. The plural LED elements 211 are disposed at one surface of the LED module 210, and the optical sheet 230 is disposed at the other surface of the LED module 210. In this case, the light emission direction of the LED elements 211 is directed to an inner upper surface of the cover bottom 220 and, as such, light emitted from the LED elements 211 travels toward the optical sheet 230 after being reflected from the upper surface of the cover bottom 220. Of course, the main FPCB 212 is made of a transparent material in order to allow easy passage of light therethrough.

As shown, a liquid crystal display (LCD) panel 241 is disposed over the guide panel 240. The LCD panel 241 is present at a corresponding location in the other structures, but it is not shown in the figures for ease of illustration.

The optical sheet 230 may include at least one of a diffusion sheet, a prism sheet, a brightness enforcement film such as a dual brightness enforcement film (DBEF) and a protective film.

When the LED module 210 has an inverted structure, as described above, the path of light travelling from each LED element 211 toward the optical sheet 230 is lengthened and, as such, it may be possible to easily induce light diffusion. In addition, it may be possible to reduce an optical length d (FIG. 4) between the inner upper surface of the cover bottom 220 and an upper surface of the optical sheet 230 disposed at an uppermost position and, as such, there may be an effect of a reduction in the thickness of the display device 200.

In other words, although a certain optical length should be secured in conventional cases in order to avoid a phenomenon that lattice mura is generated, as shown in FIG. 5A, such a lattice mura problem may be solved in the embodiment of the present disclosure, as shown in FIG. 5B, because light reflected from the inner upper surface of the cover bottom 220 is again directed to the optical sheet 230 in accordance with the inverted arrangement of the LED modules 210.

Furthermore, when the optical length d is reduced, lattice patterns may be visible due to the insufficient optical length. In this case, there may be a problem in that it is difficult to reduce the pitch of the LED elements. However, when the LED module has an inverted structure, it may be possible to secure an optical length d similar to that of conventional structures while reducing the thickness of the entirety of the display device. In this regard, it may be possible to solve the above-described problem.

Although not shown, the inner upper surface of the cover bottom 220 may be subjected to precise machining for formation of a mirror surface (not shown) in order to enhance reflectance of light emitted from the LED module 210.

Figure 7:
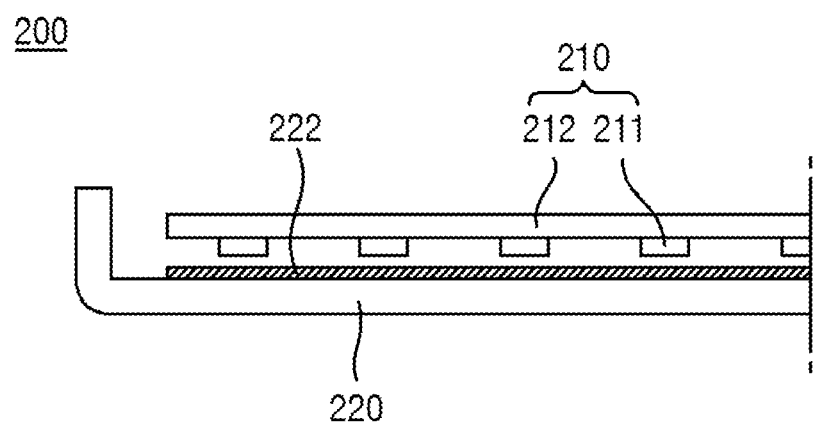
Figure 8:
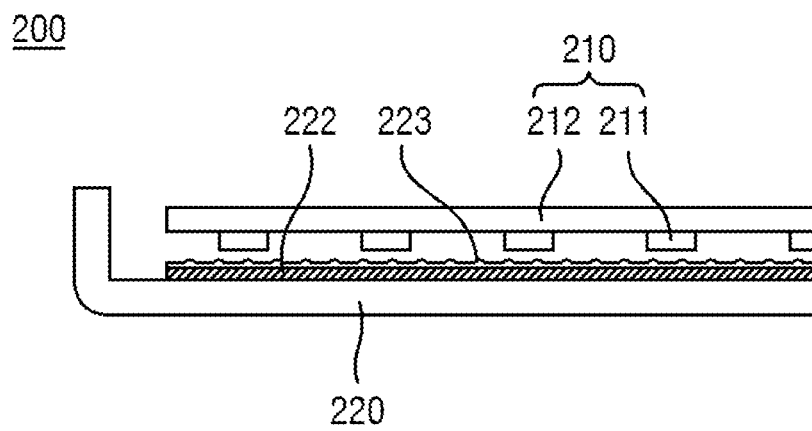

FIGS. 6 to 8 are sectional views respectively illustrating other embodiments of the display device illustrated in FIG. 4.

Referring to FIG. 6, the cover bottom 220 in the display device according to the second embodiment of the present disclosure includes first diffusion patterns 221 provided at the inner upper surface of the cover bottom 220.

The first diffusion patterns 221 may be formed integrally with the inner upper surface of the cover bottom 220. The first diffusion patterns 221 have a shape protruding from the inner upper surface of the cover bottom 220 toward the LED module 210.

The first diffusion patterns 221 have an effect capable of scattering, in various direction, light from the LED elements 211 travelling toward the inner upper surface of the cover bottom 220 and, as such, diffusion of light reflected from the cover bottom 220 may be enhanced.

FIG. 6 illustrates the first diffusion patterns 221 provided at the inner upper surface of the cover bottom 220 as having a regular semicircular cross-sectional structure. However, the first diffusion patterns 221 may be arranged to have irregular pitches or may have a cross-sectional structure having an oval shape, a polygonal shape having sides equal to or more than a triangular shape, a tooth shape or the like. In addition, the first diffusion patterns 221 may have a recessed structure without protruding from the inner upper surface of the cover bottom 220.

Referring to FIG. 7, a reflective plate 222 is provided at the inner upper surface of the cover bottom 220. The reflective plate 222 completely reflects light emitted from the LED elements 211 toward the optical sheet 230 (FIG. 4) and, as such, it may be possible to increase the pitch of the LED elements 211. In addition, this structure may be applied to a display device requiring high brightness.

Although not shown, the reflective plate 222 may be disposed only at a portion of the cover bottom 220, for example, a region between adjacent ones of the LED elements 211, in order to avoid lattice mura.

Referring to FIG. 8, second diffusion patterns 223 is provided at the inner upper surface of the cover bottom 220, together with the reflective plate 222. In this case, the function of the reflective plate 222 is identical to that of FIG. 7 and, as such, no description thereof will be given. The second diffusion patterns 223 may have the same structure as the first diffusion patterns 221.

However, the second diffusion patterns 223 provide a function similar to that of a diffuser sheet. The second diffusion patterns 223 are formed on the reflective plate 222, using a coating process or sheets type. Accordingly, the second diffusion patterns 223 have a thickness smaller than that of the first diffusion patterns 221 and, as such, there is an advantage in that the optical length does not increase. The second diffusion pattern 223 may be formed through coating of fine beads in a black coating manner and, as such, may be applied as an "anti-glare" layer.

Figure 9:
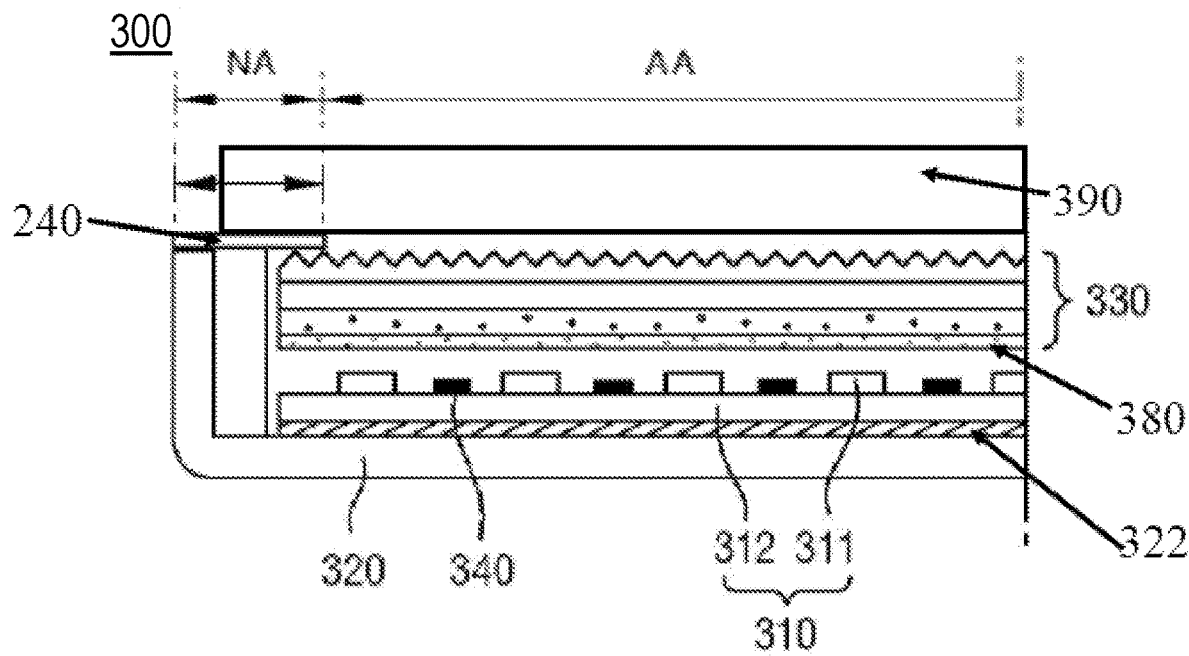
FIG. 9 is a sectional view illustrating a display device according to a third embodiment of the present invention.
Figure 10:
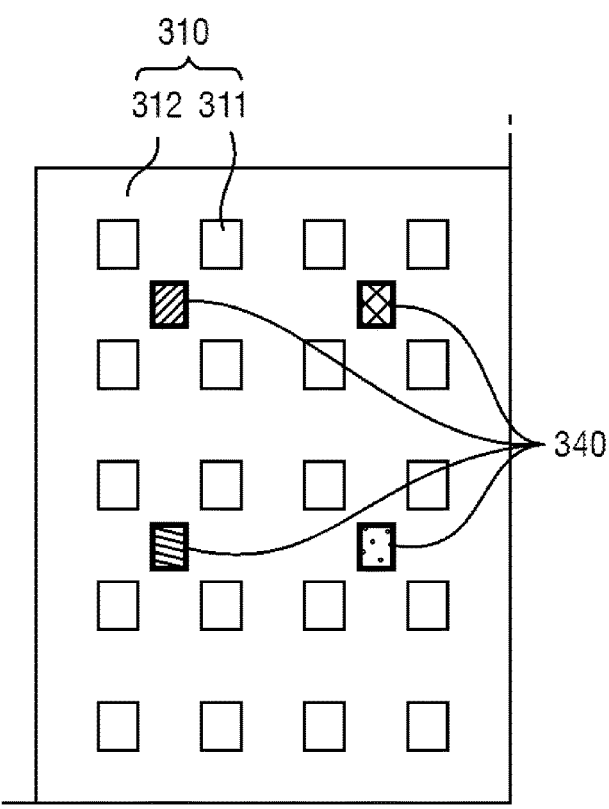
FIG. 10 is a reference view illustrating a portion of an LED module in the display device of FIG. 9 in an enlarged state.

FIG. 9 is a sectional view illustrating a display device according to a third embodiment of the present disclosure. FIG. 10 is a reference view illustrating a portion of an LED module in the display device of FIG. 9 in an enlarged state.

Referring to FIGS. 9 and 10, the display device according to the third embodiment of the present disclosure, which is designated by reference numeral "300," includes an LED module 310, a cover bottom 320, an optical sheet 330, and sensor units 340.

The LED module 310 includes a plurality of LED elements 311, and a main FPCB 312 to which the LED elements 311 are coupled.

The optical sheet 330 is disposed over the LED module 310, and the cover bottom 320 is disposed beneath the LED module 310 such that the LED module 310 and the optical sheet 330 are accommodated in the cover bottom 320.

In this case, the sensor units 340 are disposed on the main FPCB 312. Each sensor unit 340 is disposed between adjacent ones of the plural LED elements 311.

Each sensor unit 340 includes at least one of a proximity sensor, an illumination sensor, a fingerprint sensor, a near infrared (N-IR) chip, and an ultraviolet (UV) chip.

In the case of a portable terminal, a proximity sensor and an illumination sensor are disposed over a front surface of the portable terminal and, as such, it is necessary to provide a non-display area mainly for the proximity sensors and the illumination sensors. However, when the sensor units 340 are disposed between adjacent ones of the LED modules 310, it may be possible to reduce a non-display area and, as such, there may be an advantage in that a slim bezel structure or a bezelless structure may be embodied. In association with a fingerprint sensor, fingerprint recognition is possible only at a predetermined position through use of a physical button in conventional cases. However, when fingerprint sensors are disposed between adjacent ones of the LED modules 310, there may an effect capable of easily recognizing a fingerprint at any portion of a display area AA.

The N-IR chip provides a skin care function such as skin whitening, removal of dead skin cells, suppression of sebum secretion, and a reduction in the size of skin pores, using near infrared light. The N-IR chip stimulates epidermis and dermis using red-based LED light having a wavelength of about 600 to 700 nm or UV LED light having a wavelength of about 800 to 980 nm and, as such, provides an effect enabling skin to induce self-healing when stimulated.

In addition, the UV chip provides sterilization effects using UV light. For example, the user may easily sterilize an area to be sterilized, using a portable terminal provided with the UV chip. Furthermore, in this case, there may be an advantage in which the portable terminal may be used in a relatively clean state.

The display device of the present disclosure as described above may have the following effects.

First, in accordance with the display device of the present disclosure, the sub-FPCB connected to the main FPCB may be connected to the external of the display device through a through hole formed at the cover bottom and, as such, it may be possible to embody a slim bezel.

Second, the installation direction of the LED module, which is constituted by a plurality of LED elements, is inverted such that light emitted from the LED elements is directed to the upper surface of the cover bottom and, as such, it may be possible to reduce a minimum thickness of the backlight unit required for a desired picture quality.

Third, it may be possible to enhance a picture quality while reducing the thickness of the backlight unit.

Fourth, sensors such as an illumination sensor, a proximity sensor, and a fingerprint sensor are disposed between adjacent ones of the LED elements. In a portable terminal, accordingly, it may be possible to reduce the space where such sensors are disposed in conventional cases.

Fifth, when a sensor such as an N-IR chip or a UV chip is provided, there may be an effect of skin care using near infrared light or an effect of sterilization using ultraviolet light.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a first flexible printed circuit board (FPCB) having a first surface and a second surface opposite the first surface;
   a plurality of light emitting elements disposed on the first surface of the first FPCB;
   a connector on the first FPCB, the connector electrically connected to at least one of the plurality of light emitting elements;
   a second FPCB electrically connected to the first FPCB via the connector;
   a cover having a first surface and a second surface opposite the first surface, the first surface of the cover facing the first surface of the first FPCB;
   a through hole extending between the first surface of the cover and the second surface of the cover, and
   sensor units, each of which is disposed at the firat surface of the first FPCB between adjacent ones of the light emitting elements.

2. The display device according to claim 1,
wherein the connector is disposed on the second surface of the first FPCB and the second FPCB extends from the second surface of the first FPCB to the second surface of the cover through the through hole.

3. The display device according to claim 1,
wherein the connector is disposed on the first surface of the first FPCB and the second FPCB extends from the first surface of the first FPCB to the second surface of the cover through the through hole.

4. The display device according to claim 1, wherein the light emitting elements, in operation, emits light toward a light emission direction facing the first surface of the cover.

5. The display device according to claim 1, wherein, the connector is disposed at an edge portion of the first FPCB.

6. The display device according to claim 5,
wherein the cover further comprises a lateral portion surrounds the first FPCB and the lateral portion of the cover is outside of the edge portion of the first FPCB.

7. The display device according to claim 5, wherein, the edge portion where the connector is disposed does not overlap with any of the light emitting elements disposed on the first surface of the first FPCB.

8. The display device according to claim 1, wherein the cover comprises first diffusion patterns protruding from first surface of the cover in corresponding regions where the light emitting elements are disposed on the first surface of the FPCB, respectively, the first diffusion patterns being integrated with the cover.

9. The display device according to claim 1, comprising:
a reflective plate interposed between the cover and the light emitting elements.

10. The display device according to claim 9, comprising:
second diffusion patterns interposed between the reflective plate and the light emitting elements.

11. The display device according to claim 1, comprising:
an optical sheet mounted to the cover, to diffuse light emitted from the light emitting elements.

12. The display device according to claim 1, wherein each of the sensor units comprises at least one of a proximity sensor, an illumination sensor, a fingerprint sensor, a near infrared (N-IR) chip, and an ultraviolet (UV) chip.

13. The display device according to claim 1, wherein a diameter of the through hole overlaps with an edge portion of the first FPCB.

14. A display device, comprising:
a first flexible printed circuit board (FPCB) having a first surface and a second surface opposite the first surface;
a plurality of light emitting elements disposed on the first surface of the first FPCB;
a connector on the second surface of the first FPCB, the connector electrically connected to at least one of the plurality of light emitting elements;
a second FPCB electrically connected to the first FPCB via the connector;
a cover having a first surface and a second surface opposite the first surface, the first surface of the cover facing the first surface of the first FPCB, the cover at least partially surrounds the first FPCB;
a through hole extending between the first surface of the cover and the second surface of the cover; and
sensor units, each of the sensor units being disposed at the first surface of the firat FPCB between adjacent ones of the light emitting elements.

15. The display device according to claim 14, wherein each of the sensor units comprises at least one of a proximity sensor, an illumination sensor, a fingerprint sensor, a near infrared chip, and an ultraviolet chip.

16. A display device, comprising:
a first flexible printed circuit board (FPCB) having a first surface and a second surface opposite the first surface;
a plurality of light emitting elements disposed on the first surface of the first FPCB;
a connector on the first surface of the first FPCB, the connector electrically connected to at least one of the light emitting elements;
a second FPCB electrically connected to the first FPCB via the connector;
a cover having a first surface and a second surface opposite the first surface, the first surface of the cover facing the first surface of the first FPCB, the cover at least partially surrounds the first FPCB;
a through hole extending between the first surface of the cover and the second surface of the cover, and
sensor units, each of which is disposed at the first surface of the first FPCB between adjacent ones of the light emitting elements.

17. The display device according to claim 16,
wherein each of the sensor units comprises at least one of a proximity sensor, an illumination sensor, a fingerprint sensor, a near infrared chip, and an ultraviolet chip.

18. A display device, comprising:
a first flexible printed circuit board (FPCB) having a first surface and a second surface opposite the first surface;
a plurality of light emitting elements disposed on the first surface of the first FPCB;
a cover having a first surface and a second surface opposite the first surface, the first surface of the cover facing the first surface of the first FPCB, the cover at least partially surrounds the first FPCB;
a through hole extending between the first surface of the cover and the second surface of the cover;
a second FPCB electrically connected to the first FPCB and extending through the through hole; and
sensor units each disposed at a first surface of the first FPCB between adjacent ones of the light emitting elements.

19. The display device according to claim 18, wherein each of the sensor units comprises an ultraviolet (UV) chip emitting UV light for sterilization.

* * * * *

UNITED STATES PATENT AND TRADEMARK OFFICE
CERTIFICATE OF CORRECTION

PATENT NO. : 11,747,676 B2
APPLICATION NO. : 17/864058
DATED : September 5, 2023
INVENTOR(S) : Ji-Soon Oh et al.

Page 1 of 1

It is certified that error appears in the above-identified patent and that said Letters Patent is hereby corrected as shown below:

On the Title Page

"(74) Attorney, Agent, or Firm – SEED IP GROUP LLP" should read: --(74) Attorney, Agent, or Firm – SEED IP LAW GROUP LLP--.

In the Claims

Column 8, Claim 1, Line 65:
"at the firat surface" should read: --at the first surface--.

Column 10, Claim 14, Line 8:
"of the firat FPCB" should read: --of the first FPCB--.

Column 10, Claim 16, Lines 20-21:
"one of the light emitting elements;" should read: --one of the plurality of light emitting elements;--.

Column 10, Claim 16, Line 29:
"of the cover, and" should read: --of the cover; and--.

Signed and Sealed this
Twenty-fifth Day of June, 2024

Katherine Kelly Vidal
*Director of the United States Patent and Trademark Office*